(12) United States Patent
Schoch

(10) Patent No.: US 8,099,180 B2
(45) Date of Patent: Jan. 17, 2012

(54) STATE AND PARAMETER ESTIMATOR HAVING INTEGRAL AND DIFFERENTIAL COMPONENTS FOR ELECTRICAL ENERGY ACCUMULATORS

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 693 days.

(21) Appl. No.: 11/632,987

(22) PCT Filed: May 31, 2005

(86) PCT No.: PCT/EP2005/052468
§ 371 (c)(1),
(2), (4) Date: Apr. 4, 2008

(87) PCT Pub. No.: WO2006/010659
PCT Pub. Date: Feb. 2, 2006

(65) Prior Publication Data
US 2009/0048793 A1    Feb. 19, 2009

(30) Foreign Application Priority Data
Jul. 23, 2004    (DE) .......................... 10 2004 035 858

(51) Int. Cl.
*G05B 13/02*    (2006.01)
*G01R 31/36*    (2006.01)
(52) U.S. Cl. ................ 700/31; 700/28; 700/30; 700/42; 700/44; 700/45; 702/63; 702/65; 320/30; 320/132; 324/426
(58) Field of Classification Search ............. 700/28–31, 700/42, 44, 45; 320/100, 103, 132; 702/63
See application file for complete search history.

(56) References Cited

U.S. PATENT DOCUMENTS
4,390,841 A    6/1983   Martin et al.
5,349,540 A    9/1994   Birkle et al.
(Continued)

FOREIGN PATENT DOCUMENTS
EP    0 505 333    9/1992
EP    0505333 B1 *  12/1998

OTHER PUBLICATIONS

Levine, W. S. "Control System Fundamentals", CRC Press, 2000, pp. 198-199.* George Ellis, "observers in control systems, Chapter 4", Elsevier Academic press, 2002, first edition, pp. 67-96.*
Luenberger, "An Introduction to Observers", IEEE, Dec. 1971, pp. 596-602.* Luenbeger, "Observing the state of a linear system", IEEE, 1963, pp. 74-80.*

(Continued)

*Primary Examiner* — Albert Decady
*Assistant Examiner* — Olvin Lopez Alvarez
(74) *Attorney, Agent, or Firm* — Kenyon & Kenyon LLP

(57) ABSTRACT

A device is described for ascertaining state variables and/or parameters of a mathematical energy accumulator model, in particular a battery model, that describes the electrical properties of the energy accumulator on the basis of various state variables and parameters, the mathematical energy accumulator model having correction equations by which the state variables and/or the parameters are corrected and adjusted to the actual operating performance of the energy accumulator. A particularly rapid and accurate compensation of the energy accumulator model may be achieved if the error between a measured battery performance quantity and the battery performance quantity calculated by the energy accumulator model, a differentiated component of the error and an integrated component of the error are calculated, the individual components are each weighted using a weighting factor and the weighted error components are taken into account in correction of a state variable and/or a parameter.

10 Claims, 3 Drawing Sheets

U.S. PATENT DOCUMENTS

| | | | |
|---|---|---|---|
| 5,489,829 A * | 2/1996 | Umida | 318/561 |
| 5,596,260 A | 1/1997 | Moravec et al. | |
| 7,109,685 B2 * | 9/2006 | Tate et al. | 320/132 |
| 2001/0009370 A1 * | 7/2001 | Richter et al. | 324/426 |
| 2002/0130637 A1 * | 9/2002 | Schoch | 320/132 |
| 2004/0032264 A1 | 2/2004 | Schoch | |
| 2004/0162683 A1 * | 8/2004 | Verbrugge et al. | 702/64 |

OTHER PUBLICATIONS

Wonham, "On Pole assignment in Multi-Input Controllable Linear systems", IEEE, Dec. 1967, pp. 660-665.*

Luenberger, "Observers for Multivariate Systems", 1966, IEEE, pp. 190-197.*

* cited by examiner

STATE AND PARAMETER ESTIMATOR HAVING INTEGRAL AND DIFFERENTIAL COMPONENTS FOR ELECTRICAL ENERGY ACCUMULATORS

FIELD OF THE INVENTION

The present invention relates to a device for ascertaining state variables and/or parameters of a mathematical energy accumulator model, in particular a battery model and a corresponding method.

BACKGROUND INFORMATION

In electrical networks such as vehicle electrical systems that receive electrical power from a battery, it is important, in particular from the standpoint of safety aspects, to know the prevailing battery performance. In the area of automotive engineering, it is known that the state of charge (SOC) or the state of health (SOH) of the battery may be calculated from the prevailing operating parameters of the battery, in particular the battery voltage, the battery current and the battery temperature. This type of battery state detection provides information about the state of charge and/or the state of health of the battery, but it does not provide any information about the power actually deliverable or the withdrawable charge of the battery. For this reason, mathematical models of energy accumulators have already been proposed so that the chargeability, i.e., the withdrawable charge of an electrical energy accumulator, may be determined with greater precision. These are mathematical models that represent the electrical properties of the energy accumulator on the basis of various mathematical equations. These mathematical equations describe functional relationships among various state variables, e.g., battery internal voltages, currents, etc., and include various parameters that map the electrical and, if applicable, also thermal properties of the energy accumulator.

Known battery models usually include a state variable and parameter estimator, stored as software in a control unit with which the various state variables and parameters of the energy accumulator model are calculated, and a predictor capable of making a prediction about a future battery state (e.g., a battery voltage) or about the charge withdrawable from the battery, taking into account a predetermined charge profile, e.g., a current characteristic or a charge characteristic. However, known state variable and parameter estimators yield relatively inaccurate results for the desired parameters, in particular for the capacitance or the internal resistance of the battery, and therefore are not suitable for a model-based prediction or have a relatively complex structure.

SUMMARY OF THE INVENTION

The object of the present invention is therefore to create a state variable and parameter estimator for electrical energy accumulators that will map the operating performance of the electrical energy accumulator with greater precision and will thus permit better prediction of battery variables or parameters.

An important aspect of the present invention is to calculate a battery performance quantity (e.g., the battery current or the terminal voltage) with the help of a mathematical battery model with which a proportional, an integral, and a differential component of an error are determined between a measured battery performance quantity (battery voltage, current or temperature) and the battery performance quantity calculated by the mathematical energy accumulator model and to weight the individual error components each with an individual weighting factor and to couple the weighted components back into the energy accumulator model for correction purposes. A separate weighting factor is preferably assigned to each state variable and each parameter. The energy accumulator model includes various correction equations by which the state variables and/or parameters of the battery model may be corrected, taking into account the weighted error components to adjust them to the actual behavior of the energy accumulator. On the basis of the state variables and parameters corrected in this way, various performance quantities, e.g., the charge state or the withdrawable charge from the battery, may then be calculated or various battery variables may be predicted by model-based prediction.

Such a state variable and parameter estimator having feedback of a proportional, integral, and differentiated and weighed error component has the important advantage that dynamic errors may be compensated much better in particular by the differentiated component as well as static (offset) errors being compensatable in particular by the integral component. The additional feedback and taking into account the differentiated error component as well as the integral error component results in a much greater correction effect than, for example, exclusive feedback of the proportional component, i.e., the absolute error. The state variables and parameters of the battery model may therefore be determined more accurately and less ambiguously and the future battery state may be predicted with greater accuracy than when using a purely proportional error feedback.

In the case of rapid changes in charge, for example, the ohmic internal resistance may be ascertained with greater precision due to the feedback of the weighted error differential because in this way dynamic errors make a greater contribution toward the correction of the internal resistance. In a comparable manner, errors in state variables or parameters that cause a static offset error between modeled and measured performance quantities (e.g., a deviation in the initial charge state from the real value) are compensated in particular by the integral error component.

The individual feedback error components are preferably weighted as a function of an operating point. The operating point is defined in general by the prevailing values of the input variables (battery voltage, current or temperature) and the state variables of the battery model. For example, weighting of the feedback error components as a function of an operating point makes it possible to take into account only the differentiated error component for correction of the "internal resistance" state variable during the charging operation of the battery and to take into account all three error components during discharge operation. This is advisable in the case of correction of the internal resistance because in the charging case the usual battery models simulate the absolute characteristic of the battery performance quantities only inaccurately in contrast to the relative changes therein.

The weighting of the feedback error components as a function of the operating point is preferably implemented in such a way that the state variable and/or the parameter, which at the respective operating point has the greatest effect on the time characteristic, the integrated characteristic or the differentiated characteristic of the battery performance quantity to be compensated, is corrected to the greatest extent. The error between the measured battery variable and the model-based calculated performance quantity may therefore be compensated rapidly.

In addition, the integrated error component is preferably not taken into account for correction of a state variable or a parameter when their correction equations already have an integral characteristic. For example, in correction of the open-circuit voltage or the internal resistance, the integrated error component is preferably not taken into account.

The state variable and parameter estimator according to the present invention preferably includes a single energy accumulator model which is valid for the entire working range of the energy storage device. Use of different partial models for different operating ranges is not necessary in this case, so much that less effort is required to create the energy accumulator model.

DETAILED DESCRIPTION

Figure 1:
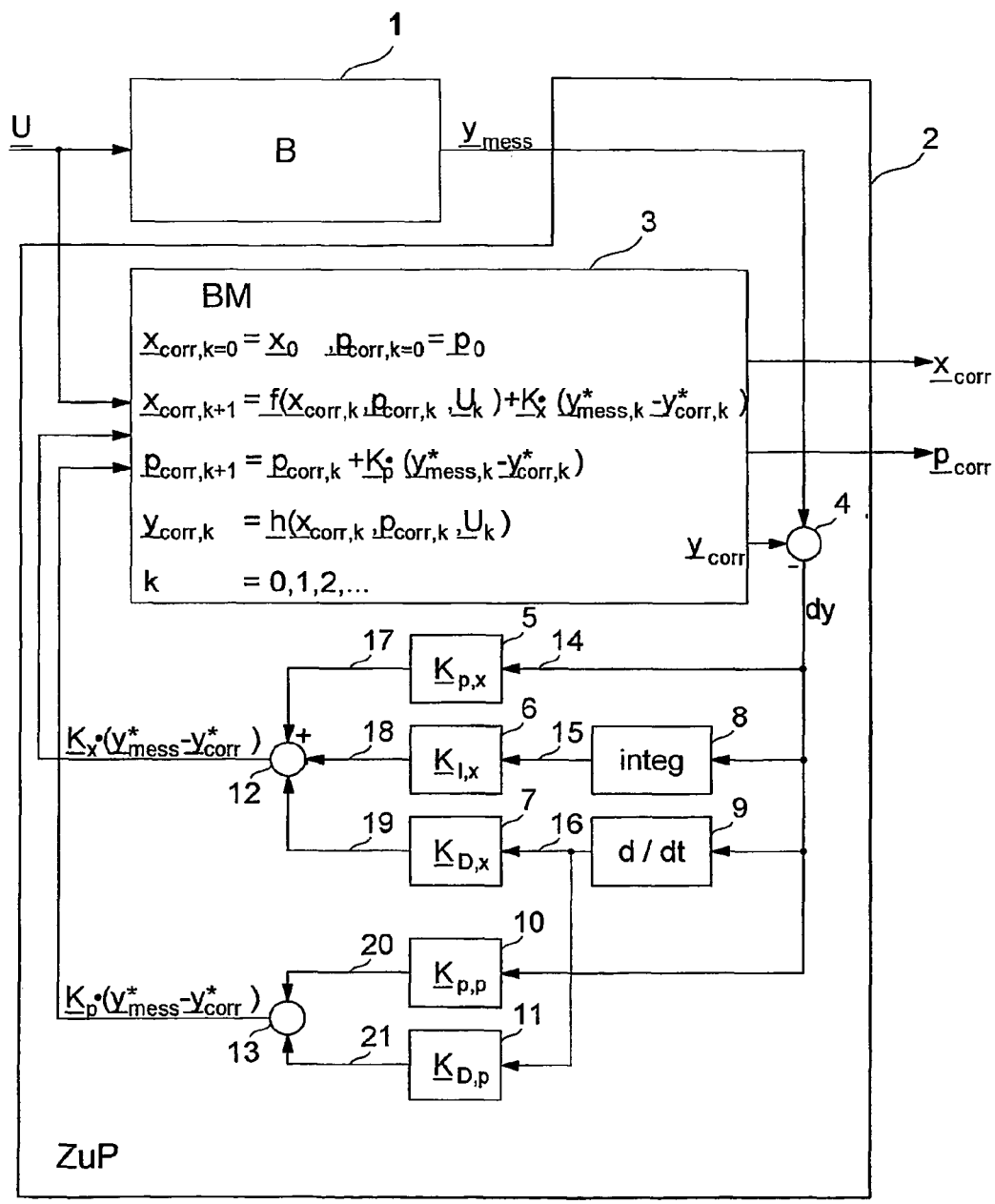
FIG. 1 shows the basic structure of a state variable and parameter estimator according to one specific embodiment of the present invention.

FIG. 1 shows a block diagram of the essential functions of a state variable and parameter estimator 2, which is used to calculate various state variables x, parameters p, and performance quantities y of a battery model 3. State variables x and parameters p thereby ascertained may then be used to calculate various battery variables such as the state of charge, the performance, the withdrawable charge, etc., and to predict the battery variables.

Battery model 3 is a mathematical model that represents the electrical or thermal battery properties, based on various physical effects, on the basis of various mathematical models. The mathematical models describe functional correlations between the state variables, e.g., voltages, currents, temperature, etc., and include various parameters p.

Battery model 3 is implemented in the present example as a universal model that describes the behavior of battery 1 in the entire operating range.

Battery model 3 processes one or more input variables u and uses them to calculate state variables x and parameters p describing the prevailing state of battery 1. The term "input variable" is understood to include one or at most two external measured variables, e.g., "battery current" $I_{Batt,meas}$, "battery temperature" $T_{Batt,meas}$ and "battery voltage" $U_{Batt,meas}$.

In addition, battery model 3 generates an output quantity $y_{corr}$ which is subtracted at node 4 from a measured battery variable $y_{meas}$ of battery 1. Output quantity $y_{corr}$ is an estimated battery performance quantity (current $I_{Batt,meas}$, temperature $T_{Batt,meas}$, voltage $U_{Batt,meas}$) which is also available as a measured quantity but without the performance quantity used as input variable u.

Error dy (calculated at node 4) between model-based calculated performance quantity $y_{corr}$ and measured performance quantity $y_{meas}$ (e.g., battery current $I_{Batt,meas}$, battery voltage $U_{Batt,meas}$ or battery temperature $T_{Batt,meas}$) is then processed further individually for each state variable x and each parameter p and fed back into battery model 3. In the feedback path of the battery model, an integrator 8 and a differentiator 9 are provided and respectively integrate and differentiate absolute error dy. Furthermore, weighting units 5 through 7, 10, 11 are provided and individually weight the individual error components (absolute error 14, integrated error 15 and differentiated error 16) for each state variable x and each parameter p. Individual state variables x and parameters p are corrected in battery model 3 by correction equations ($x_{corr,k+1}= \ldots, p_{corr,k+1}= \ldots$) until error dy is compensated.

The behavior of the battery may be represented in general as a nonlinear time-discrete differential equation system of the first order for implementation in a digital computer, wherein:

$$\underline{x}_{k=0} = \underline{x}_0 \quad (1)$$

$$\underline{x}_{k+1} = \underline{f}(\underline{x}_k, \underline{p}, \underline{u}_k) \quad (2)$$

$$\underline{y}_k = \underline{h}(\underline{x}_k, \underline{p}, \underline{u}_k) \quad (3)$$

$$k = 0, 1, \ldots$$

where $\underline{u}_k$ = the vector of the input variables of energy accumulator model 3 in time increment k (at least one, maximum of two measured battery performance quantities $I_{Batt,meas}$, $U_{Batt,meas}$, $T_{Batt,meas}$);

$\underline{x}_k$ = the vector of state variables of energy accumulator model 3 in time increment k, e.g., open-circuit voltage $U_{C0}$, polarization $U_D$, concentration polarization $\underline{U}_k$ using starting value $\underline{x}_0$;

$\underline{y}_k$ = the vector of the output quantities of energy accumulator model 3 in time increment k and includes modeled performance quantities y that are also available as measurement $y_{meas}$ but without the performance quantities used as input variables $\underline{u}_k$;

$\underline{p}$ = the vector of the parameters to be estimated of energy storage device model 3;

$\underline{f}(\underline{x}_k, \underline{p}, \underline{u}_k)$ = the right side of state differential equations of energy accumulator model 3 and $\underline{h}(\underline{x}_k, \underline{p}, \underline{u}_k)$ = the vector of the output equations of energy accumulator model 3.

Battery model 3 operates essentially as follows: state variables x and parameters p are first initialized at an initial state $x_0$ and $p_0$, respectively, and are corrected in the case of an error dy between estimated and measured output quantity y. To this end, the battery model includes correction equations ($x_{corr,k+1}= \ldots, p_{corr,k+1}= \ldots$) which calculate corrected state variables $\underline{x}_{corr}$, corrected parameters $\underline{p}_{corr}$, and corrected output quantities $\underline{y}_{corr}$ taking into account proportional error component 14, integrated error component 15, and differentiated error component 16. Individual error components 14 through 16 are generated by an integrator 8 in the feedback path and a differentiator 9 and then weighted individually as a function of the operating point. Each weighting factor is labeled with letter K, where index p denotes weighting factor $K_p$ for proportional error component 14, index I denotes weighting factor $K_I$ for integrated error component 15, and index D denotes weighting factor $K_D$ for differentiated error component 16. Weighted error components 17 through 19 are then added at node 12 and fed back into battery model 3 for correction of state variables x.

For correction of parameters p, weighting units 10, 11 are also provided for weighting proportional error component 14 and differentiated error component 16. Integrated error component 15 is not taken into account in the correction of parameters p because the correction equations of the parameters, e.g., internal resistance $R_i$ or open-circuit voltage $U_{C0}$, already have an integral characteristic.

Weighted error components 20, 21 are in turn added at a node 13 and fed back into battery model 3.

For the correction of state variables $x_{corr}$, parameters $p_{corr}$, and output quantities $y_{corr}$, the following equations apply:

$$\text{Initial values: } \underline{x}_{corr,0} = \underline{x}_0, \underline{p}_{corr,0} = \underline{p}_0 \quad (4)$$

$$\underline{x}_{corr} = \underline{x} + \underline{K}_{p,x}*(\underline{y}_{meas} - \underline{y}_{corr}) + \underline{K}_{1,x}*\text{integ}(\underline{y}_{meas} - \underline{y}_{corr})dt + \ldots \underline{K}_{D,x}* d(\underline{y}_{meas} - \underline{y}_{corr})/dt \quad (5)$$

$$\underline{p}_{or} = \underline{p} + \underline{K}_{p,p}*(\underline{y}_{meas} - \underline{y}_{corr}) + \underline{K}_{1,p}*\text{integ}(\underline{y}_{meas} - \underline{y}_{corr})dt + \ldots \underline{K}_{D,p}* d(\underline{y}_{meas} - \underline{y}_{corr})/dt \quad (6)$$

$$\underline{y}_{corr} = \underline{h}(\underline{x}_{corr}, \underline{p}_{corr}, \underline{u}) \quad (7)$$

If $x$ in equation (5) is replaced by $f(\underline{x}_k, \underline{p}, \underline{u}_k)$ according to equation (2) and state variables $\underline{x}$ and parameters $\underline{p}$ in equations (5), (6) are replaced by corrected quantities $\underline{x}_{corr}, \underline{p}_{corr}$, in each time increment k, the following recursive formulation of the estimation algorithm results.

$$\underline{x}_{corr,k=0} = \underline{x}_0, \underline{p}_{corr,k=0} = \underline{p}_0 \quad (8)$$

$$\underline{x}_{corr,k+1} = f(\underline{x}_{corr,k}, \underline{p}_{corr,k}, U_k) + \underline{K}_{p,x}*(\underline{y}_{meas,k} - \underline{y}_{corr,k}) + \ldots \underline{K}_{1,x}*\text{total}(\underline{y}_{meas,1} - \underline{y}_{corr,i})*t_{sample} + \ldots \underline{K}_{D,x}*[(\underline{y}_{meas,k} - \underline{y}_{corr,k}) - (\underline{y}_{meas,k-1} - \underline{y}_{corr,k-1})]/t_{sample} \quad (9)$$

$$\underline{p}_{corr,k+1} = \underline{p}_{corr,k} + \underline{K}_{p,p}*(\underline{y}_{meas,k} - Y_{corr,k}) + \ldots \underline{K}_{D,p}*(\underline{y}_{meas,k} - \underline{y}_{corr,k}) - (\underline{y}_{meas,k-1} - \underline{y}_{corr,k-1})]/t_{sample} \quad (10)$$

$$\underline{y}_{corr,k} = \underline{h}(\underline{x}_{corr,k}, \underline{p}_{corrcor,k}, u_k) \quad (11)$$

$$k = 0, 1, \ldots$$

where $t_{sample}$ = sampling time.

The integral component in the parameter correction in equation (10) may be omitted because replacing the model parameters with the corrected quantities yields a feedback structure having an integral behavior. The integral component may also be omitted for state variables which already have an integrating behavior, e.g., open-circuit voltage $U_{C0}$.

This structure corresponds to a state observer having additional feedback of the integrated and differentiated output error. These equations may be converted to the standard structure of a state observer having gain matrices $\underline{K}_x$ and $\underline{K}_p$:

$$\text{Initial values: } \underline{x}_{corr,0} = \underline{x}_0, \underline{p}_{corr,0} = \underline{p}_0 \quad (12)$$

$$\underline{x}_{corr,k+1} = f(\underline{x}_{corr,k}, \underline{p}_{corr,k}, \underline{u}_k) + \underline{K}_x*(\underline{y}^*_{meas,k} - \underline{y}^*_{corr,k}) \quad (13)$$

$$\underline{p}_{corr,K+1} = \underline{p}_{corr,K} + \underline{K}_p*(\underline{y}^*_{meas,k} - \underline{y}^*_{corr,k}) \quad (14)$$

$$\underline{K}_x = [\underline{K}_{p,x} \underline{K}_{I,x} \underline{K}_{D,x}], \underline{K}_p = [\underline{K}_{p,p} 0 \underline{K}_{D,p}] \quad (15)$$

$$\underline{y}^*_{corr,k} = [\underline{y}_{corr,k}; \text{total}(\underline{y}_{corr,1})*t_{sample}; (\underline{y}_{corr,k} - \underline{y}_{corr,k-1})/t_{sample}] \quad (16)$$

$$\underline{y}_{meas,k} = [\underline{y}_{meas,k}; \text{total}(\underline{y}_{meas,1})*t_{sample}; (\underline{y}_{meas,k} - \underline{y}_{meas,k-1})/t_{sample}] \quad (17)$$

$$k = 0, 1, \ldots$$

where $t_{sample}$ = sampling time.

Gain matrices $\underline{K}_x$ and $\underline{K}_p$ of the error feedback may be determined by specifying the pole according to a Luenberger observer or by minimizing a quality criterion, e.g., the minimal estimated error variance (Kalman filter). In the case of nonlinear model, the model equations must first be linearized about the prevailing operating point.

Figure 2:
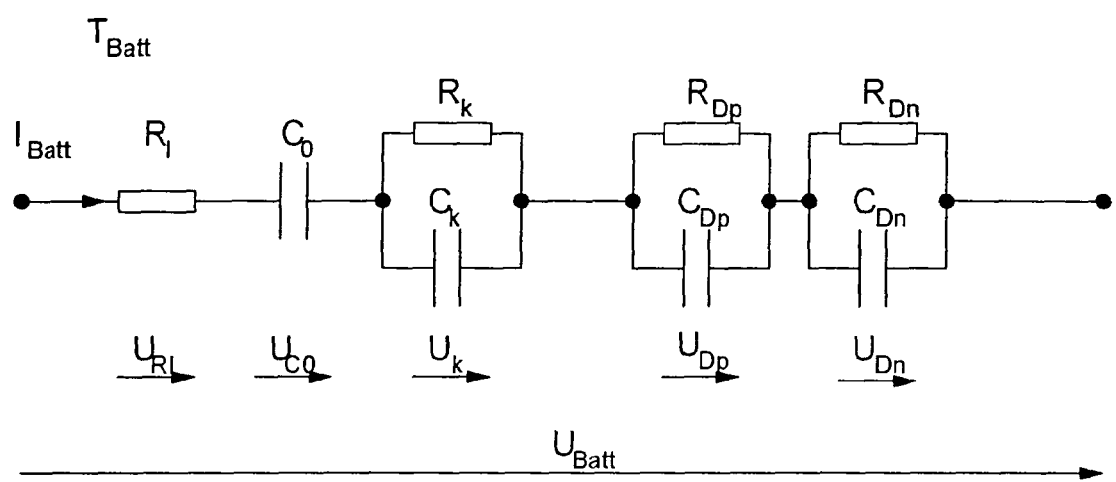
FIG. 2 shows an equivalent circuit diagram of a lead-acid battery.

FIG. 2 shows the equivalent circuit diagram of a lead battery. The counting direction of battery current $I_{Batt}$ is positive for charging and negative for discharging in the usual way. A distinction is made between performance quantities, state variables, and parameters:

Performance Quantities:
$I_{Batt}$ = battery current
$U_{Batt}$ = battery voltage
$T_{Batt}$ = battery temperature
State Variables:
$U_{C0}$ = open-circuit voltage
$U_K$ = concentration polarization
$U_{Dp}$ = average polarization of the positive electrode
$U_{Dn}$ = average polarization of the negative electrode
Parameters:
$R_I$ = ohmic internal resistance depending on open-circuit voltage $U_{C0}$, concentration polarization $U_K$, and acid battery temperature $T_{Batt}$ (e.g., battery acid temperature)
$C_0$ = replacement capacitance of the battery
$R_k$, $C_k$ = acid diffusion resistance and capacitance, respectively
$R_{Dp}$, $C_{Dp}$ = resistance and capacitance of the double layer of the positive electrode
$R_{Dn}$, $C_{Dn}$ = resistance and capacitance of the double layer of the negative electrode The individual quantities are attributable to different physical effects of the battery which are sufficiently well known from the literature and therefore will not be explained further.

Figure 3:
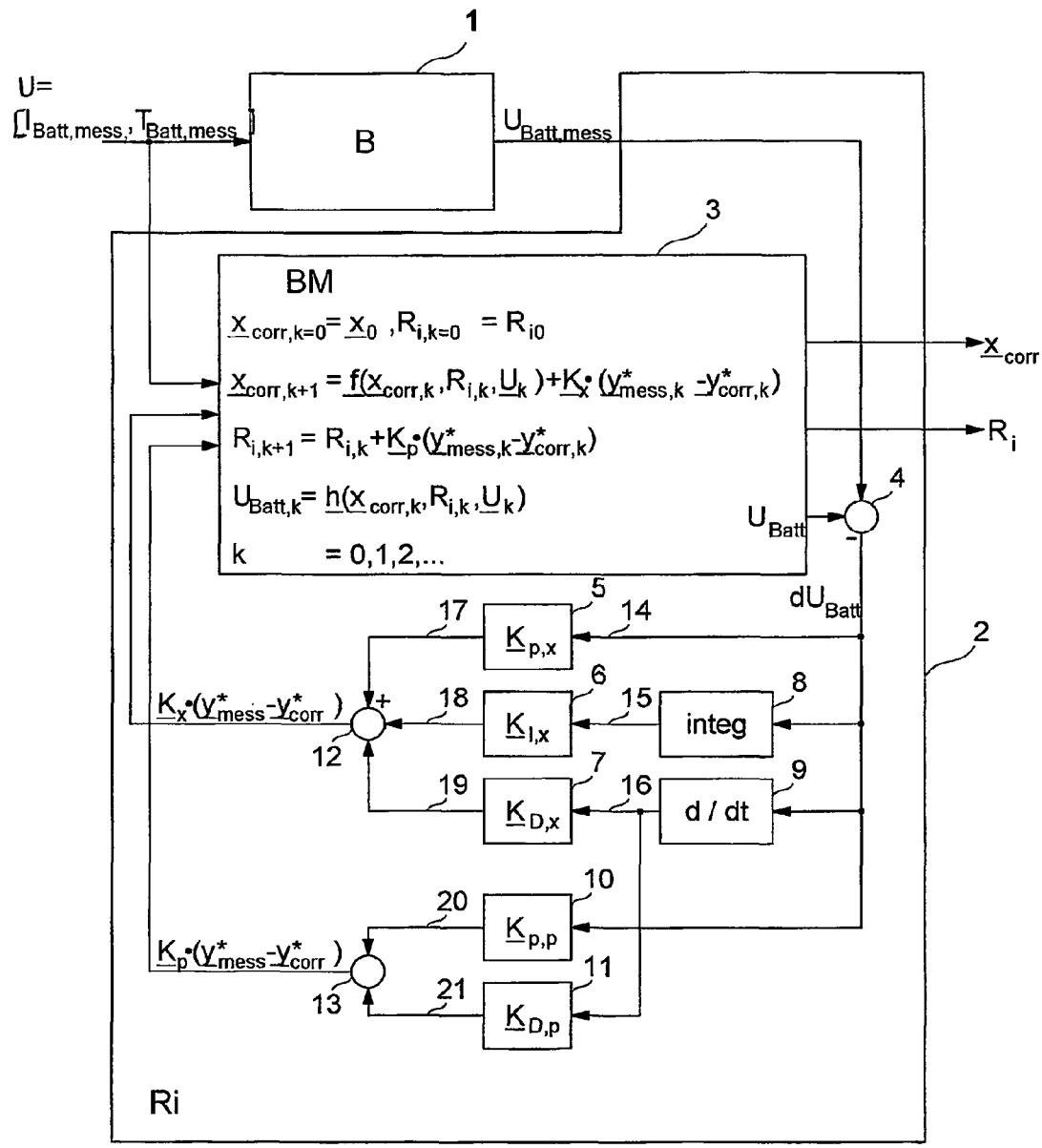
FIG. 3 shows the basic structure of an internal resistance estimator.

FIG. 3 shows the structure of a state variable and parameter estimator 2 equipped for calculating internal resistance $R_i$. Ohmic internal resistance $R_i$ of energy accumulator 1 is an important parameter in determining the efficiency of battery 1 and therefore is monitored continuously.

Input variables of battery model 3 in this case include measured battery current $I_{Batt,meas}$ and battery temperature $T_{Batt,meas}$. The output quantity of battery model 3 is battery voltage $U_{Batt}$. Measurement error $dU_{Batt}$ is calculated from estimated battery voltage $U_{Batt}$ and measured battery voltage $U_{Batt,meas}$.

For correction of state variables x, measured error $dU_{Batt}$ is in turn integrated (unit 8) and differentiated (unit 9) and individual components 14, 15, 16 are weighted individually. Weighted measurement error, $\underline{K}_x*(y^*_{meas} - y^*_{corr})$ is then fed back into battery model 3 for correction of state variables x. State variables x and ohmic internal resistance $R_i$ are balanced so that individual error components 14 through 16 are minimized.

Integrated measurement error $dU_{Batt}$ is not taken into account in the correction of internal resistance $R_i$ and open-circuit voltage $U_{C0}$ because its correction equations already have integral characteristics. In addition, proportional and integrated measurement errors 14, 15 are preferably fed back only for the discharge case and are not taken into account in the charging case to avoid faulty adaptation in charging operation due to the greater inaccuracy of the model. Ohmic internal resistance $R_i$ is thus corrected during discharging by the proportional error as well as the differentiated error but only by differentiated error 16 during charging.

LIST OF REFERENCE NUMERALS 1 battery
2 state variable and parameter estimator
3 battery model
4 subtractor node
5-7 gain factors for the state variables
8 integrator
9 differentiator
10, 11 gain factors for the parameters
12, 13 adder nodes
14 proportional error component
15 integrated error component
16 differentiated error component 17-19 amplified error components of the state variables
20, 21 weighted error for the parameter correction
u input variables
$y_{meas}$ measured performance quantities
$y_{corr}$ calculated performance quantities
$x_{corr}$ calculated state variables
$p_{corr}$ calculated parameters
dy error between measured and estimated performance quantity
$K_P$ weighting factor for the proportional error component
$K_I$ weighting factor for the integrated error component
$K_D$ weighting factor for the differentiated error component
$R_i$ internal resistance of the battery
$C_0$ replacement capacitance of the battery
$R_k$ acid diffusion resistance
$C_k$ acid diffusion capacitance
$R_{Dp}$ resistance of the double layer of the positive electrode
$R_{Dn}$ resistance of the capacitance of the double layer of the negative electrode
$C_{Dp}$ capacitance of the double layer of the positive electrode
$C_{Dn}$ capacitance of the double layer of the negative electrode
$I_{Batt}$ battery current
$U_{Batt}$ battery voltage
$T_{Batt}$ battery temperature

What is claimed is:

1. A device for ascertaining at least one of state variables and parameters of a mathematical energy accumulator model, comprising:
    a processor, including:
        an arrangement for calculating an error between a measured battery performance quantity and a battery performance quantity calculated by the energy accumulator model, a differentiated component of the error and an integrated component of the error, wherein the mathematical energy accumulator model corresponds to a battery model that describes electrical properties of an energy accumulator based on the at least one of the state variables and parameters, and wherein the energy accumulator model has correction equations to adjust the at least one of the state variables and parameters according to an actual operating performance of the energy accumulator;
        an arrangement for weighting a proportional component, the differentiated component, and the integrated component using respective weighting factors for each component calculated as functions of an operating point; and
        an arrangement for feeding back the weighted components into the energy accumulator model for correction of the at least one of the state variables and the parameters, wherein only the differentiated component corrects an internal resistance state variable during battery charging, and wherein the proportional, differentiated, and integrated components correct the internal resistance state variable during battery discharging.

2. The device as recited in claim 1, wherein the energy accumulator model is implemented as a universal model that is valid for an entire operating range of the energy accumulator.

3. The device as recited in claim 1, wherein the weighting of the individual error components as a function of the operating point is implemented in such a way that the at least one of the state variables and parameters, which at the respective operating point has the greatest effect on a time characteristic, an integral characteristic or a differential characteristic of the performance quantity to be adjusted, is corrected to the greatest extent.

4. The device as recited in claim 1, wherein at least one of the proportional component, the integral component and the differential component of the error are weighted differently during charging of a battery than during discharging of the battery.

5. The method as recited in claim 1, wherein separate weighting factors are assigned to each of the state variables and parameters.

6. The method as recited in claim 5, wherein each of the separate weighting factors is ace determined from a pole according to a Luenberger observer.

7. The method as recited in claim 5, wherein each of the separate weighting factors is are determined from a minimal estimated error variance.

8. A method, implemented using a processor, for ascertaining at least one of state variables and parameters of a mathematical energy accumulator model, comprising:
    calculating an error between a measured battery performance quantity and a battery performance quantity calculated by the energy accumulator model, wherein the energy accumulator model corresponds to a battery model that describes electrical properties of an energy accumulator based on the at least one of the state variables and parameters, and wherein the energy accumulator model has correction equations to adjust the at least one of the state variables and parameters according to an actual operating performance of the energy accumulator;
    calculating a differentiated component of the error and an integrated component of the error;
    weighting a proportional component, the differentiated component, and the integrated component with respective weighting factors for each component calculated as functions of an operating point; and
    feeding back the weighted error components into the energy accumulator model for correction of the at least one of the state variables and parameters, wherein only the differentiated component corrects an internal resistance state variable during battery charging, and wherein the proportional, differentiated, and integrated components correct the internal resistance state variable during battery discharging.

9. The method as recited in claim 8, wherein the energy accumulator model is implemented as a single model for an entire operating range of the energy accumulator.

10. The method as recited in claim 8, wherein the weighting of the individual error components as functions of the operating point is implemented in such a way that at least one of the state variables and the parameters, which at the respective operating point has a greatest effect on a time characteristic, a integral characteristic or a differential characteristic of the performance quantity to be adjusted, is corrected to a greatest extent.

* * * * *